United States Patent [19]

Tamura et al.

[11] 4,163,153
[45] Jul. 31, 1979

[54] ION BEAM MEANS

[75] Inventors: Hifumi Tamura, Hachioji; Tohru Ishitani, Sayama, both of Japan

[73] Assignee: Hitachi, Ltd., Japan

[21] Appl. No.: 852,203

[22] Filed: Nov. 17, 1977

[30] Foreign Application Priority Data

Nov. 19, 1976 [JP] Japan .................................. 51/138328

[51] Int. Cl.² ........................ C01M 23/00; H01J 27/00
[52] U.S. Cl. ........................... 250/423 R; 250/396 R; 250/398; 250/309
[58] Field of Search .................... 250/309, 310, 396 R, 250/398, 399, 423 R, 425, 306; 313/361, 363; 219/121 EB, 121 EM

[56] References Cited
U.S. PATENT DOCUMENTS

| 3,508,045 | 4/1970 | Andersen et al. | 250/309 |
| 3,742,227 | 6/1973 | Benninghaven | 250/309 |
| 3,973,121 | 8/1976 | Fite et al. | 250/425 |

*Primary Examiner*—Bruce C. Anderson
*Attorney, Agent, or Firm*—Craig and Antonelli

[57] ABSTRACT

An ion beam apparatus applies an ion beam emitted from a gaseous ion source to a solid material which constitutes a solid ion source. Ions of the solid material are emitted from the solid material as a result of the application of the exciting ion beam and are extracted by an extracting electrode and applied to a specimen.

7 Claims, 6 Drawing Figures

ION BEAM MEANS

BACKGROUND OF THE INVENTION

The present invention relates to an ion beam apparatus adapted for us in an ion microprobe analyzer or in an ion implantor and, more particularly, to an improvement in an ion source for an ion beam apparatus.

In conventional secondary ion mass spectrometry, as disclosed in U.S. Pat. No. 3,840,743, gaseous component elements such as $O_2^+$, $Ar^+$, $Ne^+$, or the like, are generally used as primary ions.

FIG. 1 shows the principle of operation of a typical conventional secondary ion mass spectrometer. The secondary ion mass spectrometer consists mainly of a primary ion beam illumination system and a scanning ion microscope. The primary ion beam illumination system is intended for generation of an ion beam and for controlling the beam so that an ion beam of desired intensity and size may be applied to the desired portion of the specimen surface.

Usually, the primary ion beam illumination system consists of a gas-leakage controlling device 1, cathode 2, intermediate electrode 3, anode 4, extracting electrode 5, condenser lens 6, object lens aperture 7, objective lens 8, electrostatic deflector 9, power source 19 for the filament, arc discharge power supply 20, accelerating power supply 21, and a lens power supply 22.

Ion beam 10, emitted from an ion gun (constituted by members 1, 2, 3, 4, and 5), is focused on a specimen 11 by a lens system 6, 8. The primary ion beam can be applied to any desired portion on the specimen, or can even scan over the area of the specimen as in the case of television, by a suitable control of the electrostatic deflector 9 and a scanning generator 28. Numeral 23 denotes a secondary ion acceleration power supply.

The mass spectrometer is constituted by a secondary ion extracting electrode 12, electrostatic sector 13, $\beta$ slit 15, secondary ion detector 16, electrostatic power supply 24, magnetic sector field 14, and its power supply 25, amplifier 26 and a secondary ion pick-up device 27. In operation, the secondary ions 18 generated by primary ion bombardment, are separated according to their mass to charge ratio by the magnetic sector field 14, are detected by a detector, and are then read out by the pick-up device 27. These ions are utilized for brightness modulation of CRT 17, as necessary.

A scanning type ion microscope consists of an auxiliary apparatus such as the aforementioned primary ion beam illumination system and mass spectrometer, and a CRT.

The arrangement is such that the primary ion is caused to scan in synchronization with the electron beam of the CRT, and the secondary ions emitted from the specimen are separated in accordance with mass to charge ratio and picked up as a specific ion which is to be used as a brightness modulation signal for CRT, so as to provide the elemental map of the specimen surface.

Usually, in the apparatus as shown in FIG. 1, a duoplasmatron type ion source is used as the ion gun, so that the primary ions are produced by an electric discharge. This means that the element to be picked up in the form of ions has to be in gaseous phase. Therefore, such an apparatus can be applied only to limited use.

Also, the ionization coefficient of the element under application of ions largely depends on the kind of elements. FIG. 2 shows ionization coefficients of various elements bombarded by electronegative ($O^-$) ions, where $O^-$ or $Ar^+$ ions are used, the ionization coefficient is extremely high for the elements such as Be, Mg, Al, Ca, In, and Be, but is quite low for elements such as S, As, Se, Cd, Te, Au, and Pt. Therefore, the sensitivity of the apparatus is much smaller for the analysis of elements such as As, Cd, Se, Te, or Au, than for these elements such as Be, Mg, or Al. This presents one of the problems inherent in the secondary ion mass spectrometer.

Meanwhile, also in the field of semiconductors, ions such as of B, As, Te, and the like, are used in a technique called ion injection. In this case, these ions are produced by ionizing a gaseous compound containing these elements, also by means of an electric discharge. Therefore, it is quite indispensable that the compound exists in the gaseous phase and, therefore, it is quite difficult to obtain solely the ion of the desired element.

The specification of U.S. Pat. No. 3,631,283 has been known as disclosing a method which makes use of a solid ion source.

According to this description, an evaporation source is provided in the ion source. The solid material is heated and evaporated into gaseous phase for ionization. This method, however, suffers from practical problems that only these elements or compounds having a low melting point and low vapour pressure can be treated by this method, that the ion beam is rendered unstable due to unstable evaporation, that the ion source is prone to be overheated to cause melting down of electrodes, and other members, and that the ion source is seriously contaminated.

A surface ionization type ion source for cesium, which functions in a manner substantially the same as that of the aforementioned method making use of solid resource, is disclosed in a document for conference of study on electronic devices (Document No. EDD-74-22, Feb. 26, 1974) published from Electric Society of Japan. Briefly, this apparatus has the following construction. Two tungsten heaters are disposed in a cylinder (inner diameter 16 mm, length 25 mm) made of nickel. Between these heaters, a mesh of tantalum is stretched. The portion closer to the ion extracting aperture is adapted to be heated to a high temperature by one heater, so as to ionize the cesium atom through the surface ionization, while the portion separated from the first mentioned portion by the tantalum mesh functions as a furnace for evaporating the cesium.

The temperatures of these portions can be controlled independently of each other, by respective heaters.

Namely, the ionization portion is heated to a temperature which is not so high but sufficient to avoid the evaporation deposition of cesium, while the furnace portion is heated to provide an optimum evaporation rate of cesium, and need not be heated to a high temperature.

The cesium ion extracted from the ionization portion through the aperture of 1 mm diameter is then focused by a lens and reaches the specimen surface.

The ion current which reaches the specimen surface depends mainly on the evaporation rate of cesium and, therefore, rapidly grows as the power supply to the heater of ion source is increased.

Although the increased ion current shortens the life, an ion current as large as several micron amperes can readily be obtained by this apparatus. As a loading material or filler, used is cesium carbonate, cesium sulfate, cesium chromate or the like.

This apparatus also relies upon heating for obtaining ion and, accordingly, suffers from the same problems as those pointed out in relation with the aforementioned apparatus.

FIG. 3 shows the relationship between the relative ionization coefficient and the atomic number of secondary ions, when Cs+ ions produced by this apparatus is used as the primary ion. From the comparison of FIGS. 2 and 3 with each other, it will be seen that S, As, Se, Cd, Te, and Au which all exhibit quite small ionization coefficients in FIG. 2, show extremely large ionization coefficients in FIG. 3 due to the bombardment by Cs+ ions.

Thus, the same element exhibits different ionization coefficients by the use of a different primary ion. This leads to the conclusion that the secondary ion analysis of high accuracy can be obtained by suitable different primary ions.

Recently, a proposal to improve the heat-resistant property and surface hardness of metal has been carried out by injecting ions into the metal surface. This also serves to increase the demand for a solid ion source. However, a solid ion source which can overcome the aforementioned problems sufficiently well has not been available up to now, so that the progress of this field of industry has been hindered.

SUMMARY OF THE INVENTION

It is therefore an object of this invention to provide an ion beam apparatus having an improved solid ion source.

To this end, according to the invention, there is provided an ion beam apparatus comprising an ion source, a lens system for focusing exciting an ion beam emitted from the ion source, an electrostatic deflector for deflecting the exciting ion beam, a solid ion source adapted to emit ions upon bombardment by the exciting ion beam and an extracting electrode for extracting the ion emitted from the solid ion source.

DETAILED DESCRIPTION OF THE INVENTION

The solid ion source used in the ion beam apparatus of the invention incorporates a solid ion source material on which bombardment is effected by an ion beam, so as to produce secondary ions of the element which constitutes the solid ion source material, as will be seen from the following description of a preferred embodiment, taken in conjunction with the attached drawings.

Figure 4:
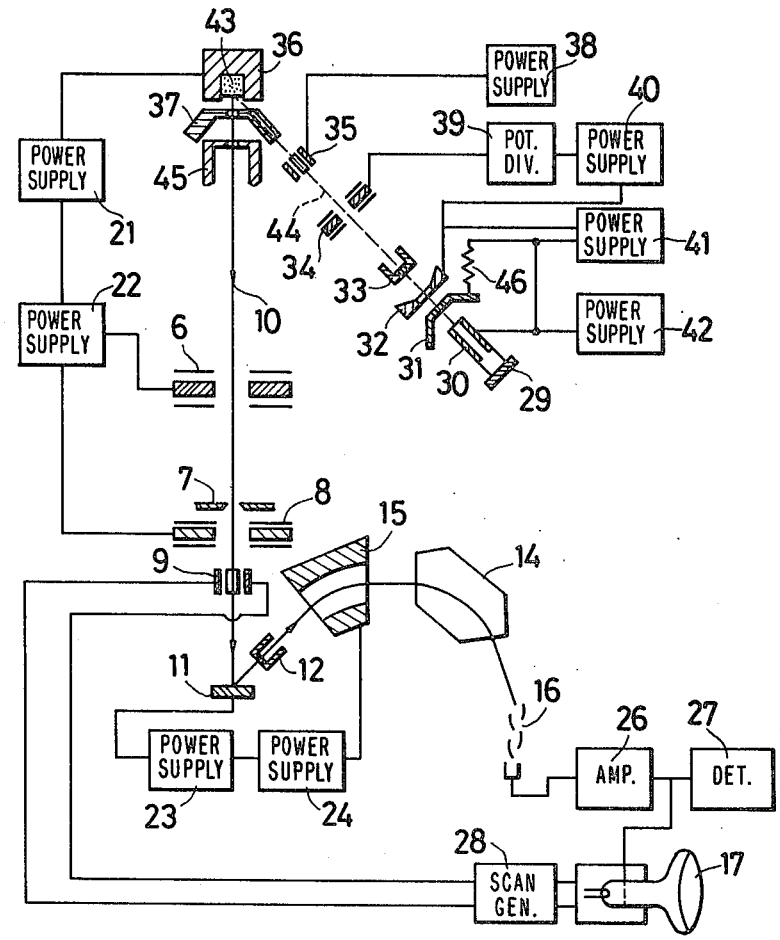
FIG. 4 is a schematic illustration of a secondary ion mass spectrometer incorporating an ion beam apparatus in accordance with the invention.

FIG. 4 schematically shows a secondary ion mass spectrometer incorporating an ion beam apparatus embodying the present invention.

The ion beam apparatus of the invention consists mainly of an ion beam illumination system for exciting primary ions and a solid ion extracting system for an extracting ion beam which is secondarily produced by an ion bombardment.

The ion beam illumination system for exciting primary ions includes a duo-plasmatron type ion source consisting of a gas-introduction device 29, cathode 30, intermediate electrode 31, anode 32, extracting electrode 33, filament power supply 42, discharge power supply 41 and an acceleration power supply 40. The system further includes a lens system 34 for focusing the ion beam, electrostatic deflector 35 for deflecting the ion beam and a power supply 38 for the deflector. Reference numerals 39 and 46 denote, respectively, a potential divider and a bias resistance. The solid ion extracting system includes a support 36 for a solid specimen, solid ion source 43, extracting electrode 45 and a controlling electrode 37.

Hereinafter, the principle of operation of the apparatus as shown in FIG. 4 will be described in detail. In the ion beam illumination system for exciting primary ions, the extracting electrode 33, beam focusing lens system 34, and the electrostatic deflector 35 are kept at the same potential as the solid ion source 43, while a higher voltage is applied by the acceleration power supply 40 to the gas-introduction device 29, cathode 30, intermediate electrode 31, and the extracting electrode 32. The ion beam 44 emitted from the esciting ion source is focused by the ion-beam-focusing lens system 34 onto the solid ion source 43. The electrostatic deflector 35 is used for adjusting the position to which the ion beam 44 is applied. The solid ion source receiving the ion bombardment then emits, due to the sputtering phenomenon, secondary ions depending on the material of the solid ion source, as well as neutral particles. These ions are extracted assuming the form of a beam, to an electric field produced by the solid ion source 43, controlling electrode 37 and the extracting electrode 45.

Due to the adoption of the ion-bombardment method, any desired kind of ion can be obtained by suitably selecting the kind of the solid ion source material, in the ion beam apparatus of the present invention.

The controlling electrode 37 is not always necessary. However, assuming that there is no provision of the controlling electrode 37, the exciting ion beam 44 will be inconveniently deflected by electric field produced by the solid ion source 43 and the extracting electrode 45, so that it becomes highly difficult to correctly apply the beam on to the solid ion source. Therefore, it is recommended that the controlling electrode 37 be provided between the solid ion source 43 and the extracting electrode 45, as shown in FIG. 4. By keeping the controlling electrode 37 at a potential which is within a range of 200 V above and below the potential of the solid ion source 43, the unfavorable deflection of the exciting beam 44 by the extracting electrode 45 is fairly avoided to ensure the correct application of the beam onto the solid ion source 43. When the ion emitted from the solid ion source 43 is positive (or negative), the potential of the controlling electrode 37 is made to be tens to hundreds of volts above (or below) the potential of the solid ion source 43, so as to adjust the focus of the ion beam emitted from the solid ion source 43 to control the divergency of the beam, so that the ion beam may effectively and efficiently reach the specimen 11.

Figure 5:
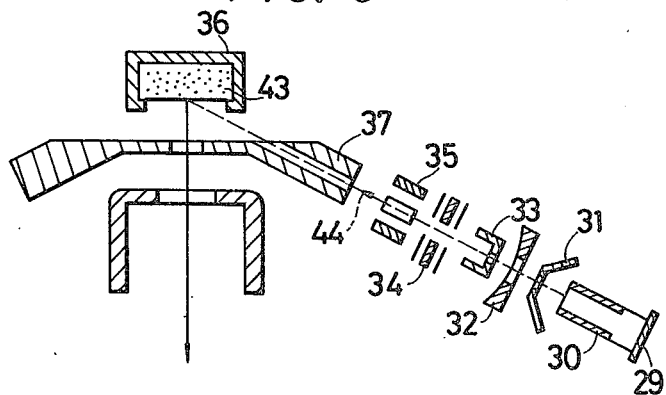
FIG. 5 shows the details of a portion of the spectrometer of FIG. 4.

As will be seen from FIG. 5, showing the detail around the controlling electrode 37, the controlling electrode 37 is provided with gaps for allowing the ion beam 44 for exciting primary ions and the primary ion (i.e., the solid ion emitted from the solid ion source) in the form of beam 10, to pass therethrough, respectively.

Hereinafter, a practical example of operation of this apparatus will be described.

High potentials of 20 kV and 10 kV were applied to the exciting ion source and the solid ion source 43, respectively, of the apparatus of FIG. 4. The following Table shows various solid ions emitted from the solid ion source, by the use of various kinds of exciting ions and solid ion source materials.

| Exciting Ions | Exciting Energy | Ion Current | Ion Source Material | Secondary Ions | Secondary Ion Current |
|---|---|---|---|---|---|
| $Ar^+$ | 10 keV | $10^{-5}$ A | NaCl | $Na^+$ | $5 \times 10^{-6}$ A |
| $Ar^+$ | 10 keV | $10^{-5}$ A | Al | $Al^+$ | $10^{-7}$ A |
| $O_2^+$ | 10 keV | $10^{-5}$ A | NaCl | $Na^+$ | $6 \times 10^{-6}$ A |
| $O_2^+$ | 10 keV | $10^{-5}$ A | Al | $Al^+$ | $10^{-6}$ A |

Concerning the bombardment by $Ar^+$ ions, the obtained secondary current (i.e., primary ion current of FIG. 4) is as large as the exciting current, due to a high ionization coefficient in case of NaCl, while, in case of $Ar^+$ bombardment on Al, the secondary ion current is reduced by two orders of magnitude ($10^{-2}$) as compared with the exciting current, because of a poor ionization coefficient.

Turning now to the bombardment by $O_2^+$ ions, the ionization coefficient is almost the same for NaCl, but the secondary ion current is increased by one order of magnitude ($10^{-1}$) for Al, as compared with the case of $Ar^+$ bombardment.

The above Table shows data concerning only NaCl and Al, but the same advantageous effect can be obtained also with other various solid materials.

It will be seen that the solid ion which could have not been extracted sufficiently well can be readily obtained by the apparatus in accordance with the invention.

This remarkable effect will be more clearly realized from the following description of an ion microprobe analyzer incorporating an ion beam means embodying the present invention, taken in conjunction with FIG. 4.

For obtaining an electropositive ion, NaCl was used as the solid ion source 43, while $Ar^+$ ion was used for the exciting ion beam 44. An adjustment was made to attain an ion beam 44 having a width or diameter of 0.5 mm$\phi$ on the solid ion source 43, while keeping the bombardment energy at 5 keV. The ions emitted secondarily from the solid ion source (NaCl) were focused by lenses 6, 8 and applied to the specimen 11. In this embodiment, the secondary ionization coefficients were measured for various metallic specimens, by applying $Na^+$ which has been one of the ions difficult to obtain.

Figure 1:
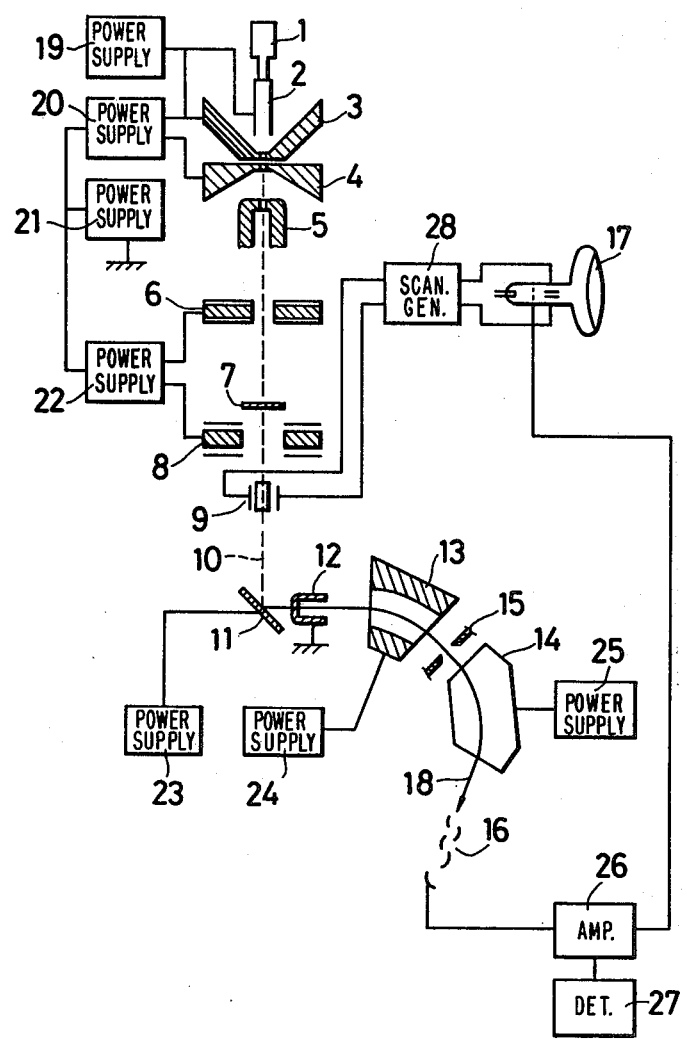
FIG. 1 is a schematic illustration of a conventional secondary ion mass spectrometer.
Figure 2:
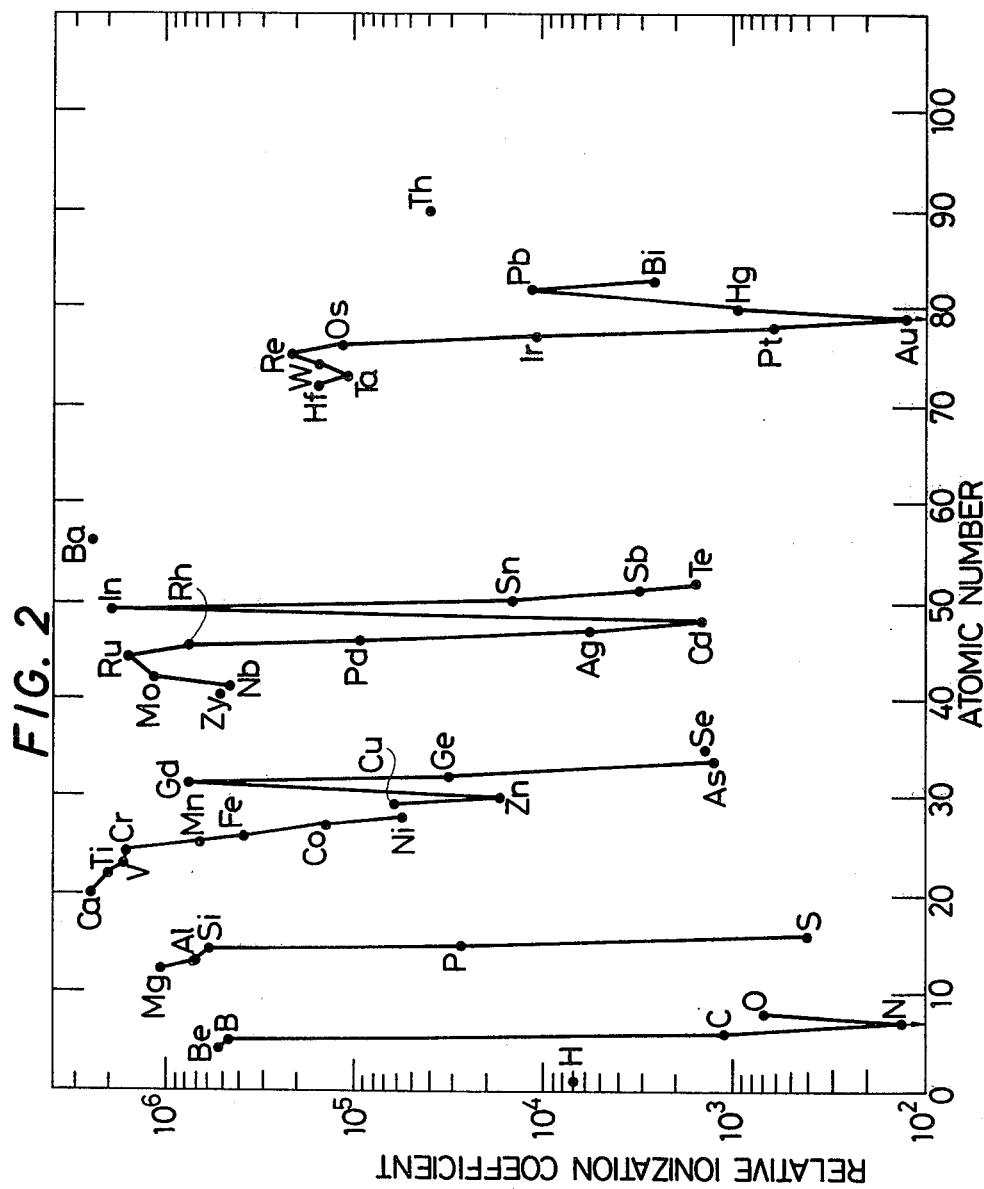
FIG. 2 shows ionization coefficients of various elements resulting from the bombardment by an electronegative ion ($O^-$)
Figure 3:
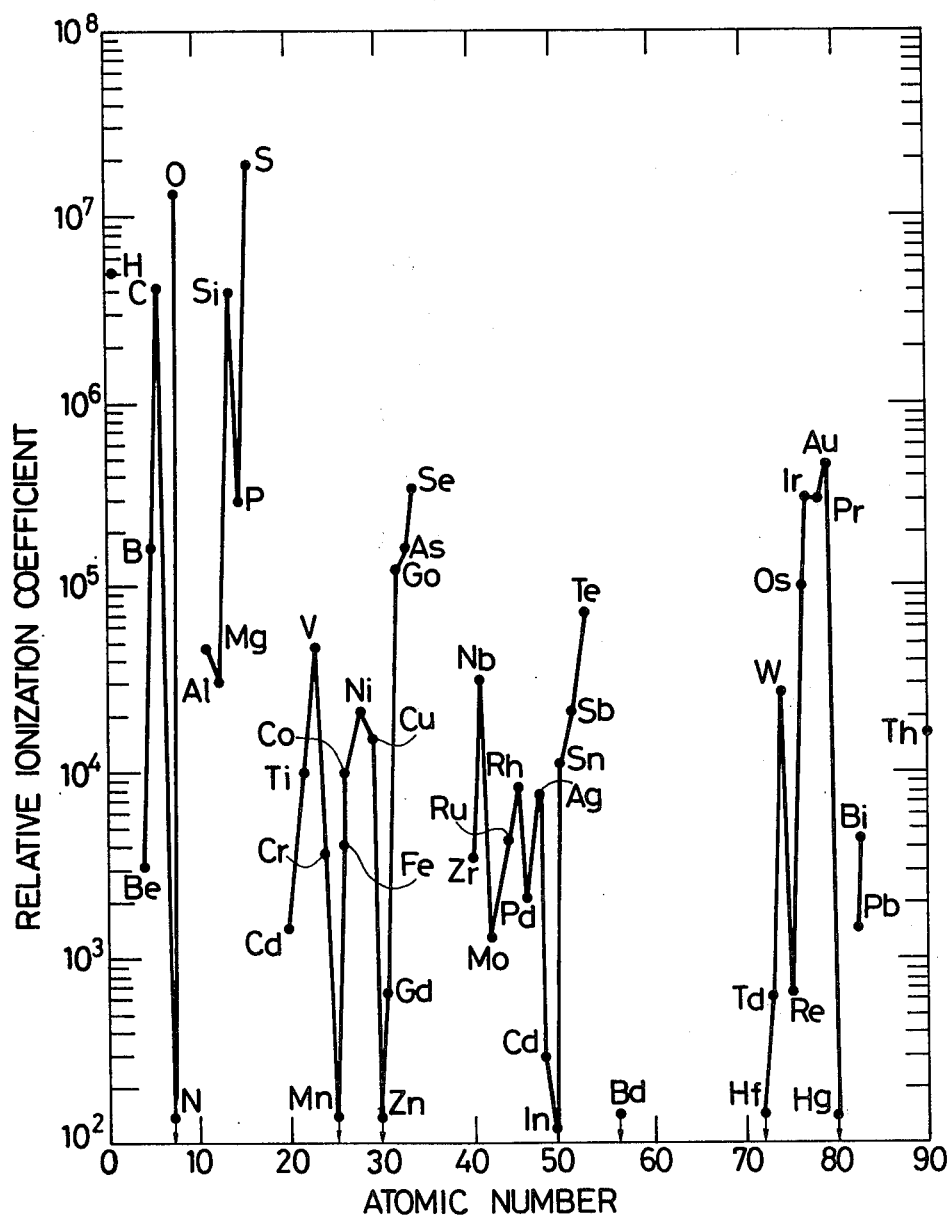
FIG. 3 shows ionization coefficients of various elements resulting from the bombardment by an electropositive ion ($Cs^+$)
Figure 6:
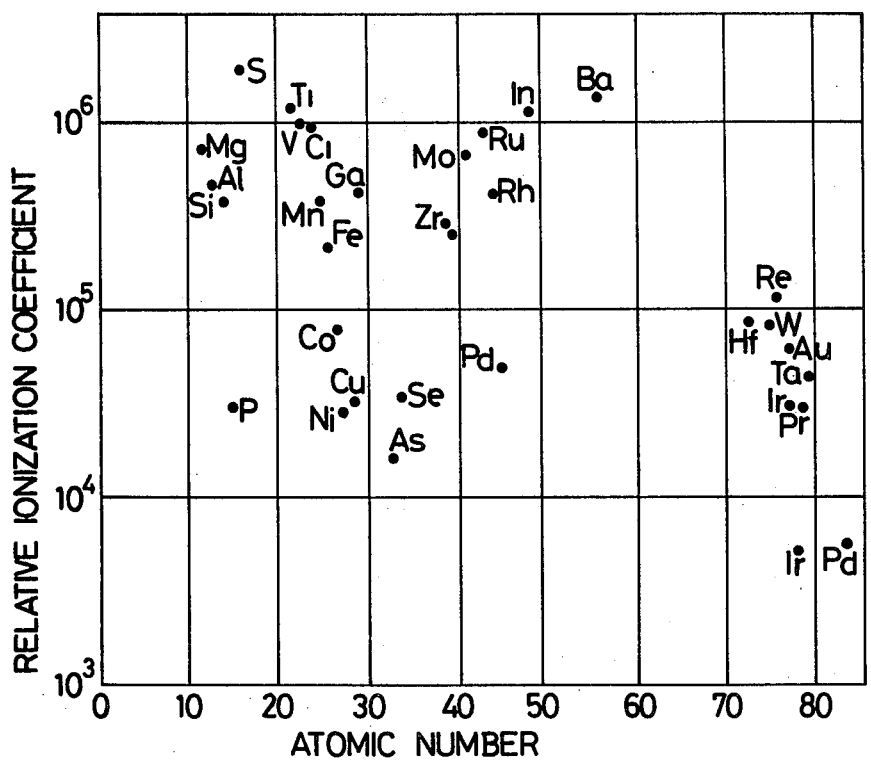
FIG. 6 is a graphical representation of ionization coefficients of various elements obtained by the ion beam apparatus in accordance with the invention.

As has been stated in relation with FIGS. 2 and 3, there are two distrinctive kinds of elements, one of which exhibits a specifically high ionization coefficient for electropositive primary ions, while the other shows a high ionization coefficient for electronegative primary ions. Thus, by adopting both kinds of primary ions at a time, the ionization coefficient can be increased and the difference of ionization coefficients between the elements can be diminished. In this embodiment, the above stated increase of the ionization coefficients and the negation of the difference of the ionization coefficients were achieved by making use of electropositive $Na^+$ ion beam as the primary ion and, while introducing electronegative $O_2$ gas into the specimen chamber. The result of the measurement is as shown in FIG. 6, from which the following conclusions are derived:

(1) The ionization-coefficient-variation is kept within 1.5 orders of magnitude, which is much smaller than that adhieved by conventional apparatus. Namely, in conventional apparatus, the ionization coefficients vary, depending upon the elements, over a range which is as large as 4 to 5 orders of magnitude. That is, the ionization coefficient variation is made more even.

(2) The absolute values of the secondary ionization coefficients of elements are standarized or levelled off at a high value, by the application of electropositive or electronegative ions.

From the foregoing description of the preferred embodiments, it will be seen that the present invention attains the following advantageous effects.

(a) Any desired solid ion which has been difficult to obtain can be extracted as a beam;

(b) By adopting a controlling electrode 37, it becomes possible to apply the exciting ion beam to any desired point on the solid ion source, avoiding the interference by other electrode systems, so as to put the ion-bombardment type ion source into practical use; and (c) When the ion beam means of the invention is applied to an ion microanalyzer, the improvement of the ionization efficiency and the levelling off of the ionization coefficients, which are highly desired for obtaining a high sensitivity of the analyzer and a good quantitativeness of the analysis, are simultaneously achieved.

While we have shown and described several embodiments in accordance with the present invention, it is understood that the same is not limited thereto but is susceptible of numerous changes and mofidications as known to a person skilled in the art, and we therefore do not wish to be limited to the details shown and described herein but intend to cover all such changes and modifications as are obvious to one of ordinary skill in the art.

We claim:

1. An ion beam apparatus comprising:
   an ion source;
   an ion-beam-focusing lens system for focusing a primary-ion-exciting ion beam emitted from said ion source;
   an electrostatic deflector for deflecting said exciting ion beam;
   a solid ion source adapted to emit ions upon receiving ion bombardment by said exciting ion beam;
   an extracting electrode for extracting ions emitted from said solid ion source and;
   a controlling electrode disposed between said solid ion source and said extracting electrode, said controlling electrode having gaps for allowing said exciting ion beam and the ion beam emitted from said solid ion source to pass therethrough, respectively.

2. An ion beam apparatus as claimed in claim 1, wherein the potential of said controlling electrode is kept higher than that of said solid ion source to such an extent as would not adversely affect said exciting ion beam, when said ion beam emitted from said solid ion source is positive.

3. An ion beam apparatus as claimed in claim 1, wherein the potential of said controlling electrode is kept lower than that of said solid ion source by such an amount as would not adversely affect said exciting ion beam, when said ion beam emitted from said solid ion source is negative.

4. An ion beam apparatus as claimed in claim 1, wherein said extracting electrode, said ion-beam-focusing lens system, said electrostatic deflector, and said solid ion source are kept at the same potential.

5. An ion beam apparatus as claimed in claim 1, wherein said solid ion source is sodium chloride.

6. An ion beam apparatus as claimed in claim 1, wherein said solid ion source is aluminum.

7. An ion beam apparatus as claimed in claim 1, wherein the potential of said controlling electrode is maintained at a prescribed value, relative to the potential of said solid ion source, which ensures the non-deflection of said exciting beam away from the gap in said controlling electrode through which said exciting beam passes to impinge upon said solid ion source.

* * * * *